United States Patent
Kantani et al.

(10) Patent No.: US 9,170,935 B2
(45) Date of Patent: Oct. 27, 2015

(54) SEMICONDUCTOR MEMORY DEVICE

(71) Applicant: Kabushiki Kaisha Toshiba, Tokyo (JP)

(72) Inventors: Tomoyuki Kantani, Kanagawa (JP); Yoshii Akagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 311 days.

(21) Appl. No.: 13/779,603

(22) Filed: Feb. 27, 2013

(65) Prior Publication Data
US 2013/0290610 A1   Oct. 31, 2013

(30) Foreign Application Priority Data
Apr. 27, 2012   (JP) .................................. 2012-103766

(51) Int. Cl.
| | |
|---|---|
| *G06F 12/00* | (2006.01) |
| *G06F 12/02* | (2006.01) |
| *G06F 11/14* | (2006.01) |
| *G06F 11/08* | (2006.01) |
| *G11C 7/10* | (2006.01) |
| *G06F 11/10* | (2006.01) |
| *G11C 29/04* | (2006.01) |

(52) U.S. Cl.
CPC ............ *G06F 12/0246* (2013.01); *G06F 11/08* (2013.01); *G06F 11/1068* (2013.01); *G06F 11/14* (2013.01); *G11C 7/1006* (2013.01); *G06F 2212/7202* (2013.01); *G06F 2212/7203* (2013.01); *G06F 2212/7207* (2013.01); *G06F 2212/7209* (2013.01); *G11C 2029/0411* (2013.01); *Y02B 60/1225* (2013.01)

(58) Field of Classification Search
CPC ................... G06F 12/0246; G06F 2212/7202; G06F 2212/7207; G06F 2212/7209; G06F 11/14; G06F 11/08
See application file for complete search history.

(56) References Cited

U.S. PATENT DOCUMENTS

| | | |
|---|---|---|
| 2005/0226046 A1 | 10/2005 | Lee |
| 2009/0003058 A1 | 1/2009 | Kang |
| 2009/0049229 A1* | 2/2009 | Honda et al. .................. 711/101 |
| 2011/0060863 A1 | 3/2011 | Kimura et al. |

FOREIGN PATENT DOCUMENTS

| | | |
|---|---|---|
| JP | 06-342402 | 12/1994 |
| JP | 2009-009688 | 1/2009 |
| WO | 00/45257 A3 | 8/2000 |

* cited by examiner

*Primary Examiner* — Shawn X Gu
(74) *Attorney, Agent, or Firm* — Patterson & Sheridan, LLP

(57) ABSTRACT

A semiconductor memory device includes a memory unit configured in page units, an error correction code (ECC) module for generating error correcting codes, a page information addition module for generating page information, and a controller for controlling the reading and writing of data to the memory unit. The controller is configured to associate error correction code information and page information with each frame unit of data written to the memory unit and to store the associated information with each frame unit. The controller is configured to output data to an external host in sizes less than one page unit, such as one frame unit.

20 Claims, 13 Drawing Sheets

SEMICONDUCTOR MEMORY DEVICE (FIRST EMBODIMENT)

(FIRST EMBODIMENT) THE CASE OF READ OF ONLY THE
ANTERIOR HALF 8 KB OF 16 KB DATA (8 KB + 8 KB)

SEMICONDUCTOR MEMORY DEVICE

CROSS-REFERENCE TO RELATED APPLICATION

This application is based upon and claims the benefit of priority from Japanese Patent Application No. 2012-103766, filed Apr. 27, 2012, the entire contents of which are incorporated herein by reference.

FIELD

Embodiments described herein relate to a semiconductor memory device.

BACKGROUND

There has been an increase in the number of storage appliances and consumer electronic devices which include semiconductor memory devices, such as NAND-type flash memory storage, which require a controller for controlling the operation of the semiconductor memory device.

Generally, memory controllers have been configured so that the data stored in the memory device can be read out per page, where the page is the smallest readout unit, when a host device requests data to be read from the semiconductor memory device.

For this reason, the readout time of the semiconductor memory devices cannot be shortened below the time necessary to read out one page unit of stored data and high-speed read operations are hindered.

DETAILED DESCRIPTION

The present disclosure describes a semiconductor memory device suitable for high-speed operations. In general, embodiments will be explained with reference to the figures. In the following explanation, as the semiconductor memory device, a memory system including an NAND-type flash memory will be mentioned as an example; however, the present disclosure is not limited to NAND-type flash memory and other memory types are contemplated.

According to an embodiment, a semiconductor memory device, includes a memory unit configured in page units (data units in page size), an error correction code (ECC) module configured to generate an error correcting code for each frame unit within each page unit written to the memory unit, a page information addition module configured to add page information to each frame unit written to the memory unit; and a controller controlling the writing of data to the memory unit and the reading of data from the memory unit. The controller associates an error correcting code and page information with each frame unit of the data written to the memory unit and can output data read from the memory unit in less than a page unit in response to the read request from an external host.

According to an embodiment, in a semiconductor memory device provided with a memory unit configured for a data read operation and a data write operation by a page unit, an ECC module for generating error correcting codes, an page information addition module for generating page information, and a controller for controlling the memory unit, wherein the controller receives write data and a write request of the write data from an external host; the ECC module generates the error correcting codes for each of several frame data in which the write data are divided at a frame unit smaller than the page unit; the identification information addition module generates the identification information for each of these several frame data and stores the several frame data, the error correcting codes, and the identification information in the memory so that the error correcting codes and the identification information on first frame data are stored at an address in the memory between the first frame data and other frame data of these several frame data; and an output request of readout data, which are included in the first frame data, is received from the host, the first frame data and the error correcting codes and the identification information on the first frame data are read out without reading out the other frame data of the memory, and the read data are output to the host.

(First Embodiment)
<1. Example Structure>
1-1. Memory System

Figure 1:
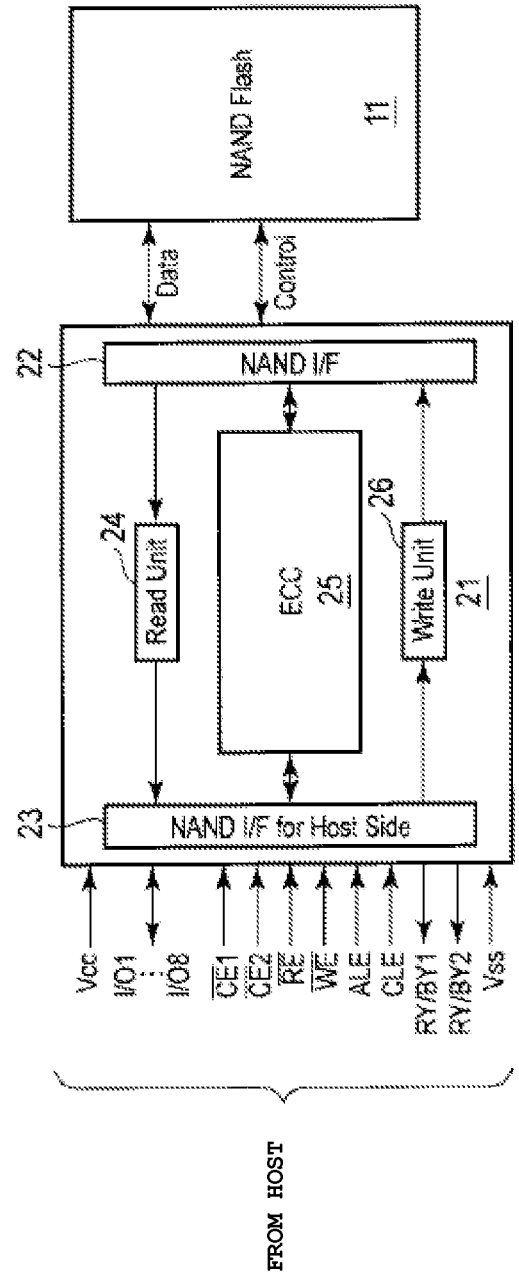
FIG. 1 is a block diagram illustrating a semiconductor memory device according to a first embodiment.

First, the overall structure of a memory system of a semiconductor memory device according to the first embodiment will be explained with reference to FIG. 1.

The semiconductor memory device of this example is provided with a NAND-type flash memory 11 as a data storage element (memory unit) and a memory controller 21 for controlling the memory unit 11.

The NAND-type flash memory (NAND Flash) 11 includes blocks in which several memory cells are arranged.

The memory controller 21 includes NAND interfaces 22 and 23, a data read module 24, an ECC module 25, a data write module 26, and the like.

The NAND interface (NAND I/F) 22 is a memory unit interface module that handles transfer of data, addresses, and the like, between the controller 21 and the NAND-type flash memory 11.

The NAND interface (NAND I/F for Host side) 23 handles transfer of data, addresses, commands, and the like, between the controller 21 and an external host (Host) not shown in the figure. A power supply voltage is applied to Vcc and Vss. Read data, write data, commands, and addresses are transmitted using I/O1-I/O8. A chip enable signal is transmitted using /CE1 and /CE2. A read enable signal is transmitted using /RE. An address latch enable signal is transmitted using ALE. A command latch enable signal is transmitted using CLE. A ready/busy signal is transmitted using RY/BY1 and RY/BY2. The sequence using these signals will be described later.

The data read module (Read Unit) 24 carries out a data read operation of the NAND-type flash memory 11 via the NAND interface 22.

When write data are written into the NAND-type flash memory 11 via the NAND interface (memory unit interface) 22, the ECC module 25 adds an error correcting code (ECC) to each prescribed frame. In addition, the ECC module 25 detects errors in the data read out of the NAND-type flash memory 11 via the NAND interface 22 and restores the data as required.

The data write module (Write Unit) 26 carries out a data write operation of the NAND-type flash memory 11 via the NAND interface 22.

1-2. Memory Block

Next, a constitutional example of memory blocks (BLOCK), which are arranged in the NAND-type flash memory 11, will be explained with reference to FIG. 2. Here, BLOCK 1 is used as an example. Since data of memory cells in the block (BLOCK 1) are collectively erased, the block is a data erasure unit.

The memory block (e.g., BLOCK 1) includes several memory cell units MU that are arranged in the word line direction (WL direction). The memory cell unit MU includes a NAND string (a memory cell string), which is arranged in the bit line direction (BL direction) intersecting with the WL direction and include, for example, eight memory cells (MC0 to MC7) whose current path is connected in series, a source side selective transistor S1, which is connected to one end of the current path of the NAND string, and a drain side selective transistor S2, which is connected to the other end of the current path of the NAND string.

Here, in this example, the memory cell unit MU includes 8 pieces of memory cells MC0 to MC7; however, the memory cell unit may include two or more memory cells, 56 cells, 32 cells, etc., without being limited to 8 cells.

The other end of a current path of the source side selective transistor S1 is connected to a source line SL. The other end of a current path of the drain side selective transistor S2 is connected to a respective bit line extending in the BL direction.

The word lines WL0 to WL7 extend in the WL direction and are commonly connected to a control gate of several memory cells in the WL direction. A selective gate line SGS extends in the WL direction and is commonly connected to the selective transistors S1 in the WL direction. A selective gate line SGD also extends in the WL direction and is commonly connected to the selective transistors S2 in the WL direction.

Figure 2:
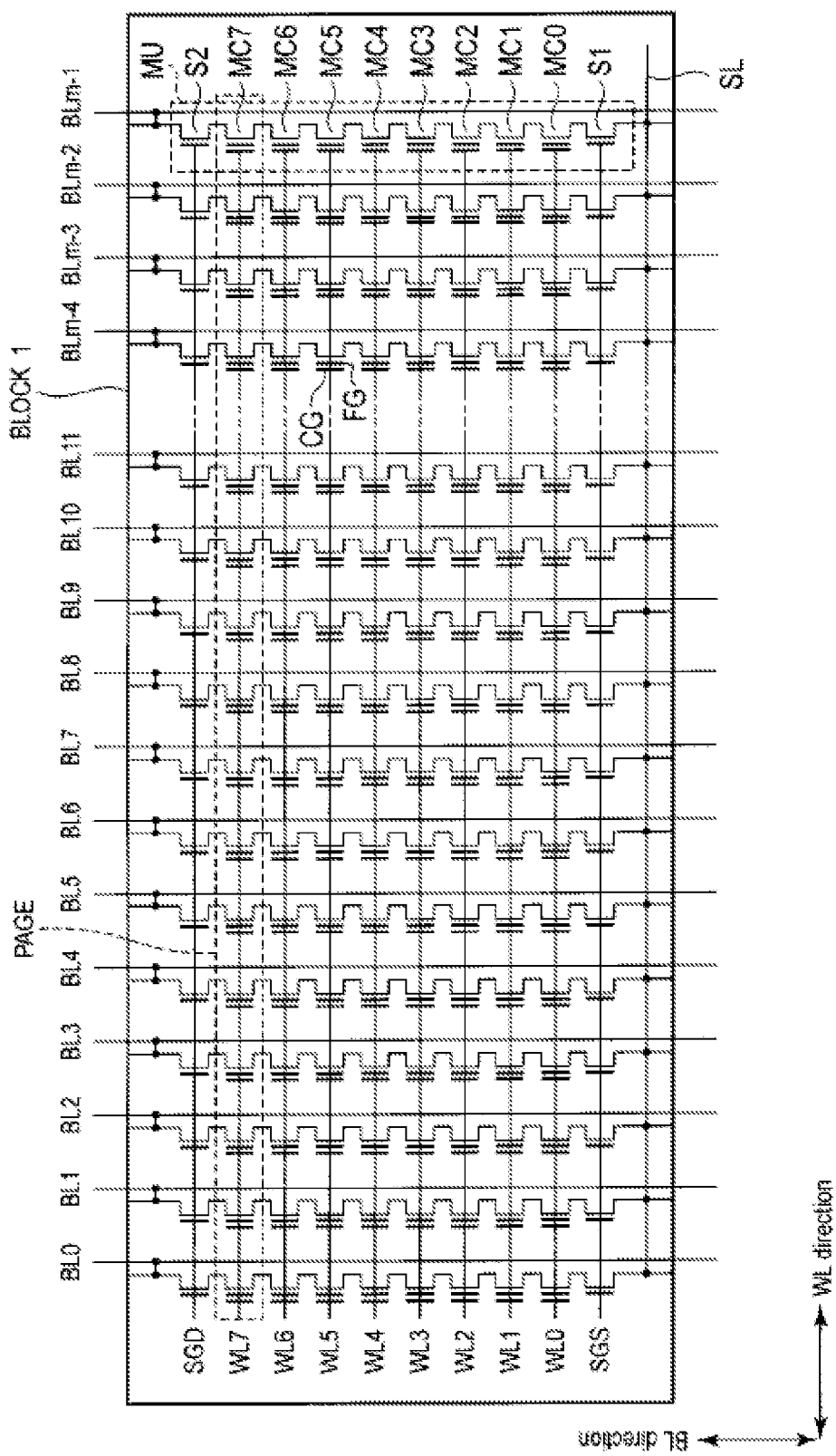
FIG. 2 is a circuit diagram illustrating a memory block.

In addition, a page (PAGE) corresponding to each word lines WL0 to WL7 is formed by the connected memory cells connected to the word line For example, as shown by being enclosed with a broken line in FIG. 2, a page 7 (PAGE 7) exists corresponding to the word line WL7. Data read operations and data write operations are generally carried out by page (i.e., each word line). For this reason, the page (PAGE) is the standard data read unit and a data write unit.

However, in this example, as will be described later, data read, and other data operations can be carried out by each frame in a page by adding page information to each frame in a page.

1-3. Page information addition module

Figure 3:
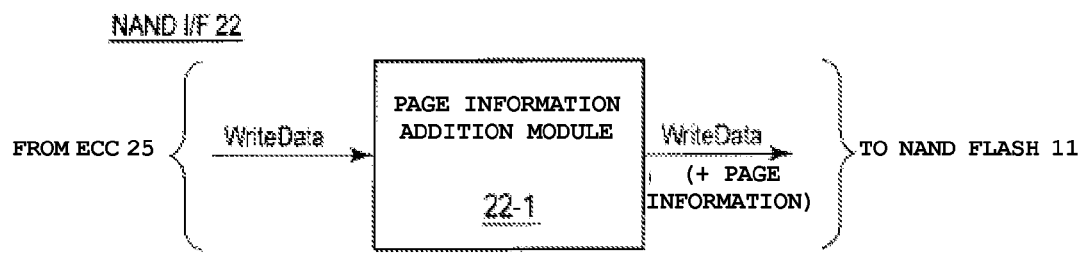
FIG. 3 is a block diagram illustrating a page information addition module in an NAND interface.

Next, a page information addition module 22-1 of this example will be explained with reference to FIG. 3.

The page information addition module 22-1 is, for example, arranged in the NAND interface 22.

As shown in the figure, the page information addition module 22-1 adds page information to each frame. The frames are smaller than a page unit which is typically used as a read unit or a write unit for write data received from a host. Here, the frame is a data unit divided by the error correcting code (ECC) that is added by the ECC module 25 and is also called an ECC frame. The page unit and frame unit will be explained with reference to FIGS. 4A and 4B.

The write data, to which the page information has been added, are written into the NAND-type flash memory 11 by the data write module 26.

1-4. Page Structure

Next, a page structure of this example will be explained with reference to FIGS. 4A and 4B. Here, an example of one page of 16 KB is shown. In addition, in the page constitution shown in FIGS. 4A and 4B, pages are allocated to page addresses from a lower position to a higher position in the vertical direction of the figure, and data are allocated to column addresses from a lower position to a higher position in the horizontal direction of the figure.

Figure 4A:
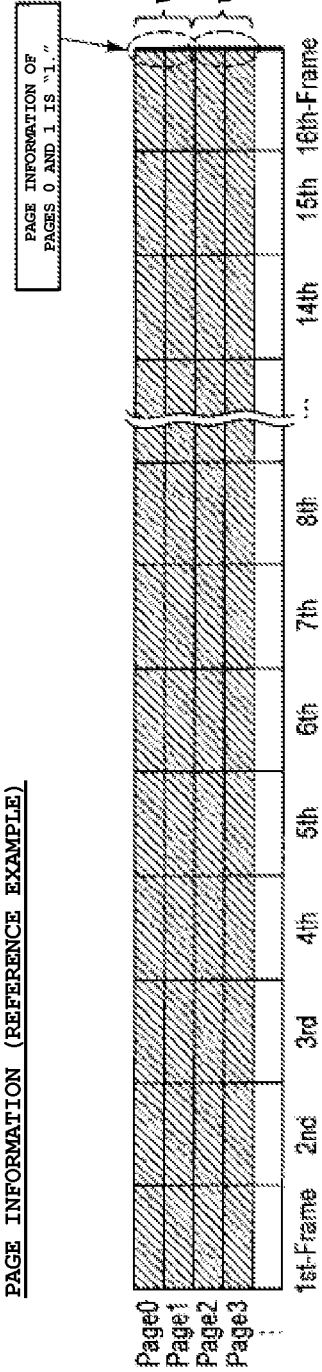
FIGS. 4A and 4B illustrate a page structure according to the first embodiment.

FIG. 4A shows a page structure of a reference example. As shown in the figure, in the page structure of the reference example, page information can be added only to the last frame (16th frame). For example, the page information is information showing whether or not data have been written to the page. PAGES 0 and 1 in the figure are written pages, and the page information of the sixteenth frame (16th Frame) is, consequently, "1." Similarly, PAGES 2 and 3 are unwritten pages, and the page information of the sixteenth frame (16th Frame) is "0."

Figure 4B:
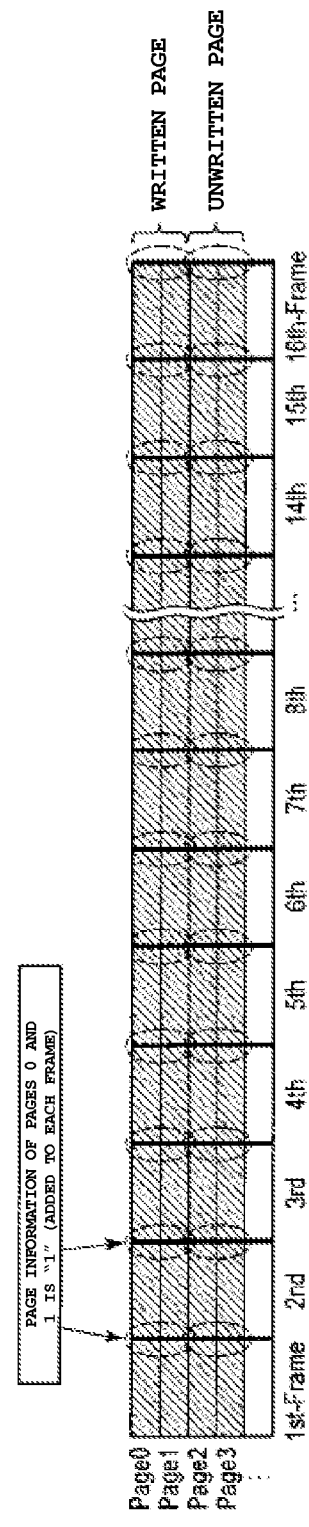

FIG. 4B shows a page structure according to the first embodiment. As shown in the figure, the distribution of page information is different from that of the reference example in that page information is added to all of the first to sixteenth frames (1st to 16th frames) of each page.

For example, PAGES 0 and 1 in the figure are written pages, and all the page information of all the first to sixteenth frames (1st to 16th frames) are therefore "1." The page information may be added as written flag information to a redundant area other than the frame data area of the first to sixteenth frames (1st to 16th frames) by the page information addition module 22-1.

Here, for example, in case part of the pages can be written by Partial Write command, or a similar command, 1 is written to only the portion of the page that is written.

PAGES 2 and 3 are unwritten pages, and all the page information of all the first to sixteenth frames (1st to 16th frames) are "0."

Therefore, in the page structure of this example, page information is added to each frame. In other words, in one page, for example, an error correcting code of the first frame data and page information are stored between the second to sixteenth frames (2nd to 16th frames) and the first frame data. For this reason, DataOut can be carried out by frame (frame unit), if necessary. In addition, even in DataOut of single frame, page information can be obtained.

For example, in case only the anterior (first) half 8 KB of 16 KB data of one page is required, the memory controller 21 carries out DataOut of only the anterior half 8 KB at a time of DataOut from the NAND-type flash memory 11. The reason for this is that since page information can be obtained even by DataOut of any frame when only the anterior half 8 KB is needed, whether or not writing of the page has been finished can be decided.

As a result, in this example, compared with the case of DataOut of the data size (16 KB in this example) of the whole one page from the NAND-type flash memory 11, the data read time (tR) can be shortened.

<2. Operation>

2.1 Data write operation (Write)

Figure 5:
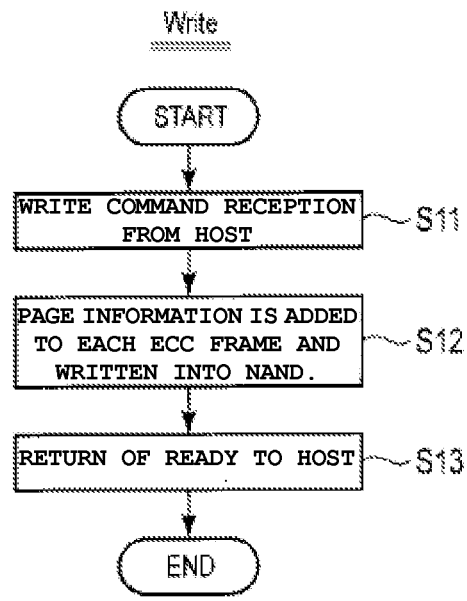
FIG. 5 is a flow chart of a data write operation of the semiconductor memory device according to the first embodiment.

With reference to FIG. 5, a data write of this example will be explained.

(Step S11)

As shown in the figure, first, the memory controller 21 receives a Write command from an external host (HOST).

(Step S12)

Next, according to the Write command, the memory controller 21 adds page information to each frame (ECC frame) of write data received from the host and writes the data into the NAND-type flash memory 11. At that time, the same page information is added to all the frames.

For example, as shown in FIG. 4B, in the written pages PAGE 0 and 1, equivalent "1" information is added as the page information to all of the first to sixteenth frames (1st to 16th frames).

Next, the memory controller 21 writes the write data into the NAND-type flash memory 11 with a prescribed address in a state in which page information is added to each frame. In the meantime, a ready/busy signal (R/B) indicating a "busy (Busy)" state is sent to the host.

(Step S13)

Next, if the data write is finished, the memory controller 21 informs the host using the ready/busy signal (R/B) indicating a "ready (Ready)" state.

2-2. Setup DataOut Size

Figure 6:
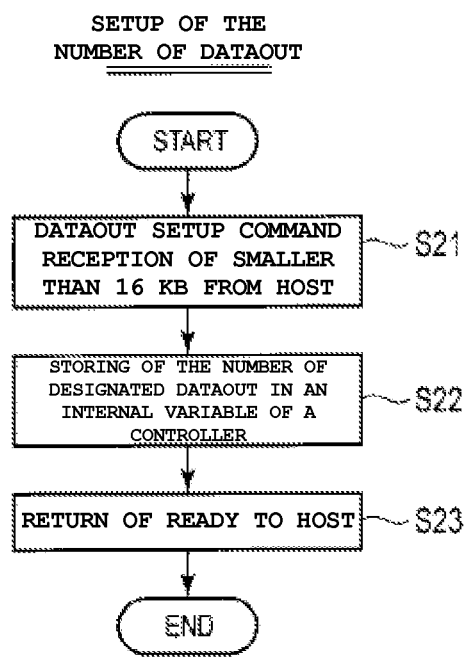
FIG. 6 is a flow chart of a data output quantity setup operation of the semiconductor memory device according to the first embodiment.

A setup DataOut size of this example will be explained with reference to FIG. 6. In this example, the case wherein DataOut of the anterior half 8 KB or smaller of a 16 KB page unit is designated by the host is used as an example.

(Step S21)

As shown in the figure, first, the memory controller 21 receives a DataOut designation command of the data size smaller than 16 KB from an external host (HOST). In this example, a command for designating DataOut size is received.

(Step S22)

Next, the memory controller 21, for example, stores the DataOut size (the number of DataOut) as an internal variable in the controller 21 according to the designation of the command received from the host.

(Step S23)

Next, if the internal variable is stored and the setup of the DataOut size is finished, the memory controller 21 informs the host by the ready/busy signal (R/B) indicating a "ready (Ready)" state.

2-3. Data Read Operation (Read) of the Designated DataOut Size

Figure 7:
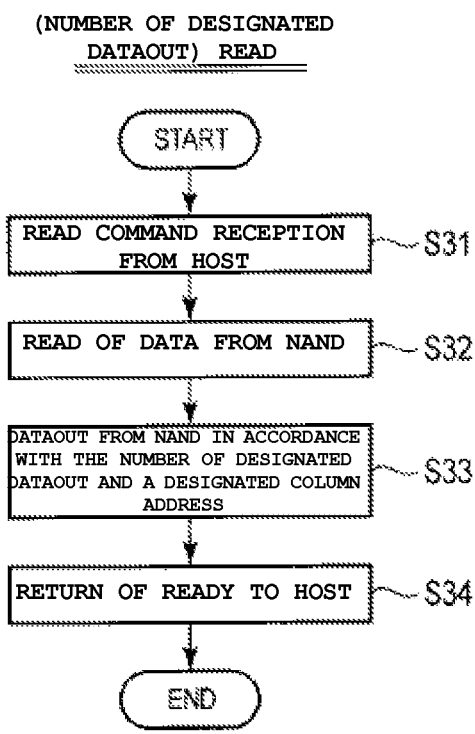
FIG. 7 is a flow chart of a data read operation of the semiconductor memory device according to the first embodiment.

With reference to FIG. 7, a data read operation of this example will be explained. In this example, data are read out according to the data output designation (DataOut designation) from the host.

(Step S31)

As shown in FIG. 7, first, the memory controller 21 receives a Read command from an external host (HOST).

(Step S32)

Next, the memory controller 21 reads out data of the memory 11 in accordance designated DataOut size (number of the DataOut) and a designated column address (start address) of a received command. At that time, the DataOut is carried out for the designated DataOut size.

For example, first, data are once read at a page unit out of the memory 11. Next, the read data (Data) of the first to eighth frames of the anterior half 8 KB corresponding to the state of page information are output (DataOut) to the controller 21 from the memory 11 in accordance with the changed variable of the designated DataOut size and the designated column address (start address) of the received command. (Step S34)

Next, if the data output (DataOut) to the host is finished for the read data (Data) of the first to eighth frames of the anterior half 8 KB, similarly, the memory controller 21 informs the host by the ready/busy signal (R/B) indicating a "ready (Ready)" state.

2-4-1. Read of Only the Anterior Half 8 KB

Figure 8:
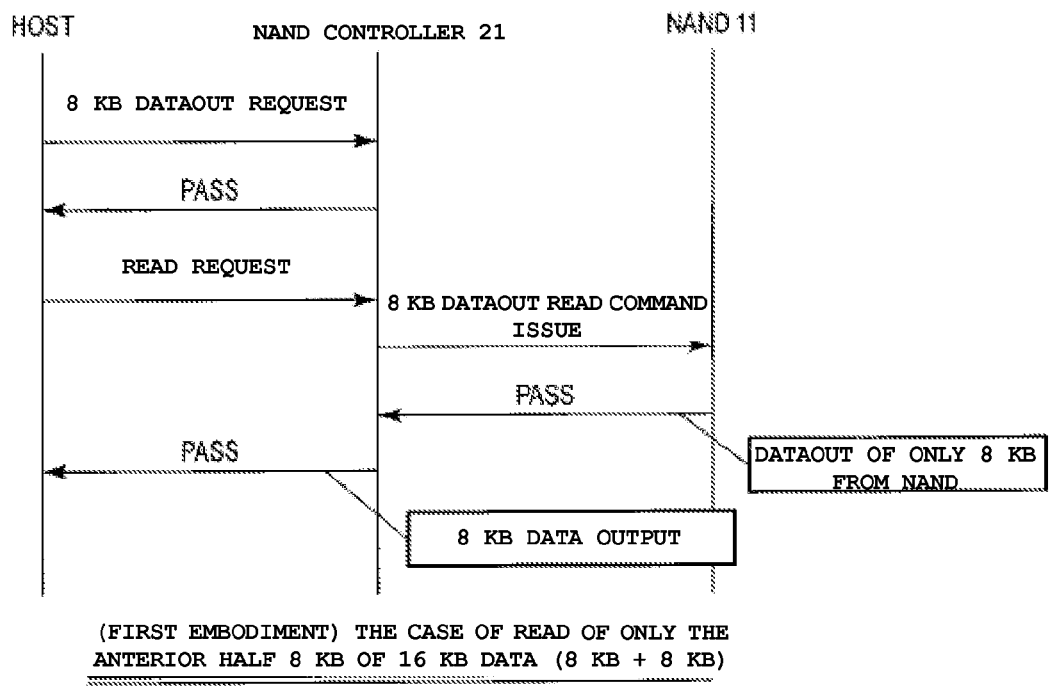
FIG. 8 illustrates the relationship between a host and a semiconductor memory device during a data read operation according to the first embodiment.

Next, with reference to FIG. 8, the relationship between the host, the controller 21, and the NAND-type flash memory 11 in the case wherein only the anterior half 8 KB is read will be explained.

As shown in the figure, first, the host (Host) requests the memory controller 21 to carry out DataOut of 8 KB. At that time, the host (Host) designates only the Dataout size for the memory controller 21.

Next, the memory controller 21 sets an internal variable according to the request. If the conversion processing of the internal variable is finished, the memory controller 21 informs the host of the end of the processing.

Next, the host designates the column address as 0 and requests the controller 21 to output data of the 8 KB (Read request).

Next, the controller 21 issues an internal Read command for DataOut of the anterior half 8 KB to the NAND-type flash memory 11.

Next, in the NAND type flash memory 11, data of one page are read out to the sense amplifier (not shown in the figure), which are electrically connected to the bit lines of the memory cell array. Next, DataOut of only the required data (frame) from the NAND-type flash memory 11 to the controller 21 is carried out in accordance with the set for DataOut size and the start address.

For example, of the data of one page read out of the NAND-type flash memory 11, Dataout of the first to eighth frames of the anterior half 8 KB from the NAND-type flash memory 11 to the controller 21 is carried out in accordance with the set DataOut size (8 KB) and the start address (column address of 0, in this example). But, DataOut of the ninth to sixteenth frames (the latter half 8 KB of the page) from the NAND-type flash memory 11 to the controller 21 is not carried out.

In addition, from the page information of the data of DataOut from the NAND-type flash memory 11 to the controller 21, the controller 21 decides whether or not writing of these data has been finished for each frame. Moreover, the controller also carries out a processing of the ECC correction result for each frame.

Next, the controller 21 outputs the read data of the first to eighth frames of the anterior half 8 KB read out of the NAND-type flash memory 11 to the external host.

2-4-2. Data Read Sequence

Figure 9:
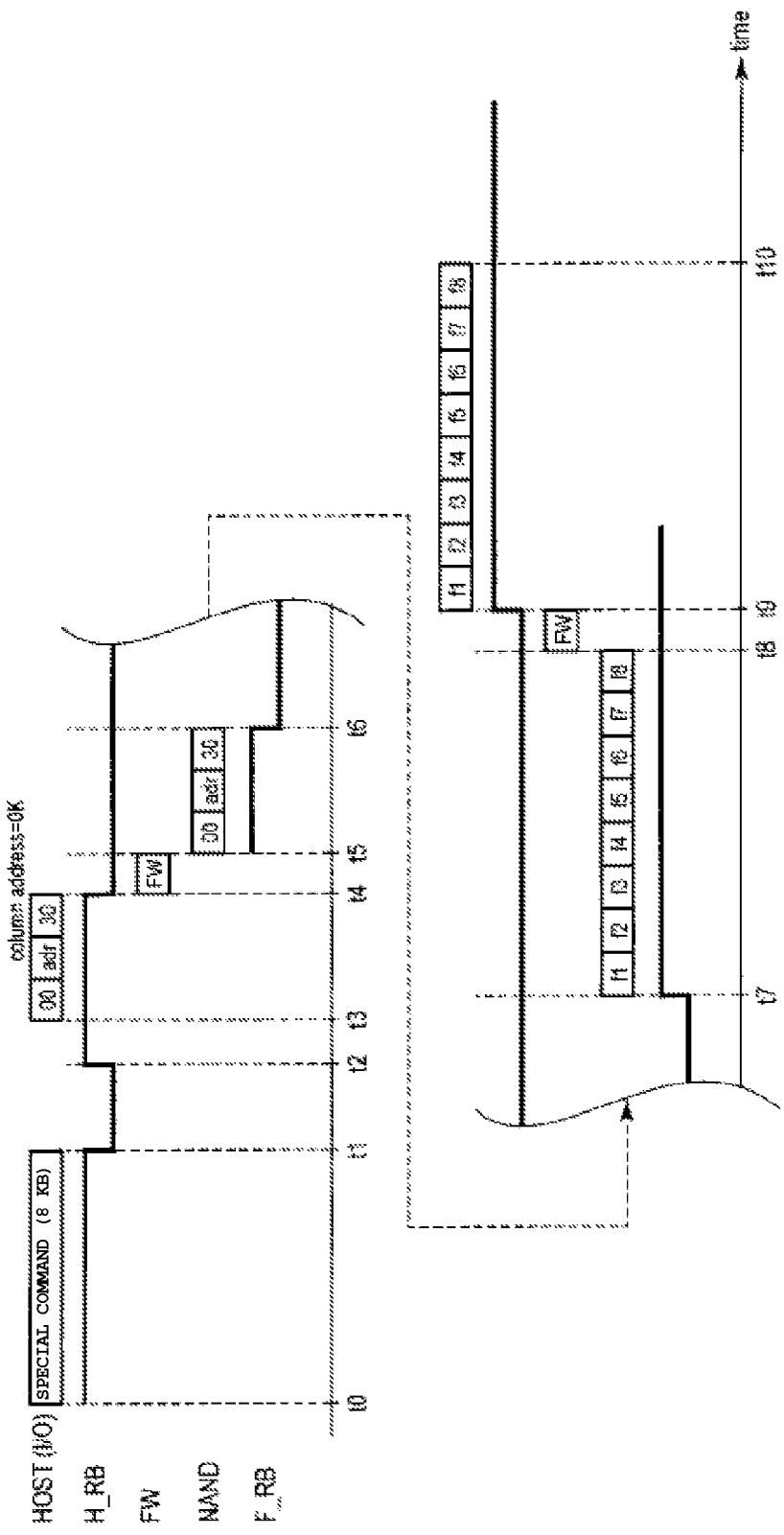
FIG. 9 is a timing chart illustrates a data read operation according to the first embodiment.

Next, with reference to FIG. 9, the sequence of the example wherein the anterior half 8 KB is read will be explained. "HOST (I/O)" of FIG. 9 indicates commands, address, and data that are transferred via I/O1 to I/O8 between the host and the NAND interface 23. "H_RB" indicates a state of the ready/busy signal that is output to the host from the NAND interface 23 via RY/BY1 and RY/BY2. "FW" indicates an internal operation of the memory controller 21, such as the operation of the data read module 24, the ECC module 25, and the data write module 26. "NAND" indicates command, address, and data that are transferred between the NAND interface 22 and the NAND-type flash memory 11. "F_RB" shows a state of the ready/busy signal that is output to the NAND interface 22 from the NAND-type flash memory 11.

First, at time t0, in a state in which the ready/busy signal (H_RB) of the host is "Ready," a special command for designating the DataOut size (the number of DataOut) is transmitted to the controller 21. In this example, this command is designated so that 8 KB is output. The command is introduced into the controller 21 via the NAND interface 23 from the I/O1 to I/O8.

Next, at time t1 to t2, in a state in which the ready/busy signal (H_RB) of the host is "Busy," the controller 21 sets an internal data read variable of the controller 21 according to the introduced command. In this example, the variable is set so that data of 8 KB are read out. At that time, the controller 21 only changes the DataOut size according to the introduced command.

Next, at time t3, in a state in which the ready/busy signal (H_RB) of the host is "Ready," the host transmits command 00h, address adr, and command 30h to the controller 21. At that time, the column address is set to, for example, 0 K start (that is, the column address is 0 K).

Next, at time t4 to t5, in a state in which the ready/busy signal (H_RB) of the host is "Busy," the controller 21 implements the following firmware processing (FW). First, whether or not the address adr received is a valid address existing in the NAND type flash memory 11 is decided. Secondly, the amount of data, which are to be read out from a certain start address, is determined for the NAND-type flash memory 11 by the column address and the set size variable of the received command. For example, in this example, the readout address from the NAND-type flash memory 11 is 0 K start (the column address is 0 K) according to the command, and the read out of the data up to the anterior half 8 KB is determined by the set variable (DataOut size).

Next, at t5 to t6, in a state in which the ready/busy signal (F_RB) of the memory 11 is "Ready," when the address adr is valid, the controller 21 outputs command 00h, address adr, and command 30h similar to the ones to the NAND-type flash memory 11.

Next, at time t6 to t7, the memory 11 returns the ready/busy signal (F_RB) in a "Busy" state to the controller 21. At that time, data of one page are read out to the sense amplifier (not shown in the figure) in the NAND-type flash memory 11, which are electrically connected to the bit lines of the memory cell array.

Next, at time t7 to t8, in a state in which the ready/busy signal (F_RB) of the memory 11 is "Ready," when the data of one page read out of the NAND-type flash memory 11 are transferred to data buffer (not shown in the figure) which are electrically connected to the sense amplifier, DataOut of only the read data (f1 to f8) of the first to eighth frames of the anterior half 8 KB based on the start address and the set size variable is carried out from the NAND-type flash memory 11 to the controller 21.

Next, at time t8 to t9, in a state in which the ready/busy signal (H_RB) of the host is "Busy," the controller 21 implements the following firmware processing (FW). First, for the data (f1 to f8) of DataOut of the first to eighth frames of the anterior half 8 KB read, whether or not writing of these data has been finished is decided for each frame using the page information (that is, the page information is checked to determine if the read data is valid data). Secondly, for the data (f1 to f8) that is subject to DataOut, ECC is checked for each frame, and an error correction process is implemented.

Next, at time t9 to t10, in a state in which the ready/busy signal (H_RB) of the host is "Ready," only the read data (f1 to f8) of the first to eighth frames of the anterior half 8 KB passed through the ECC check are output to the host from the controller 21.

<3. Operation Effect>

According to the semiconductor memory device of the first embodiment, at least the following effects (1) and (2) can be obtained.

(1) The data read time (tR) can be shorted, achieving an advantage for high-speed operations.

As previously mentioned, the semiconductor memory device of this example is provided with the page information addition module (identification information addition module) 22-1 for adding page information (DataOut identification information) for each frame.

For this reason, in the page structure of this example, as shown in FIG. 4B, equivalent "1" information is added as page information to all the first to sixteenth frames (1st to 16th frames) in the written pages PAGES 0 and 1.

In addition, in a data read operation, the memory controller 21 sets an internal data read variable of the controller 21 according to a special command for setting the number of DataOut introduced from the host.

Next, according to a Read command of the column address is 0 from the host, data of one page are read out of the NAND-type flash memory 11. Next, for the data of one page read, only the read data (f1 to f8) of the first to eighth frames of the anterior half 8 KB according to the start address and the set variable are output to the controller 21 from the NAND-type flash memory 11.

For example, since the page information exists in each frame as shown in FIG. 4B, DataOut of only the frame designated by the host can be carried out. Therefore, as compared with the case wherein the data size (16 KB) of the whole of one page is output to the host, the data read time (tR) can be shorted, achieving an advantage for high-speed operations. Here, since the data read time (tR) is almost entirely occupied by the DataOut time from the NAND-type flash memory 11, the fact that the read data size can be reduced to about a half, as in this example, can mean that the effect on the high-speed operations is significant.

On the contrary, a reference example, which will be described later, as shown in FIG. 4A, has a page structure in which page information exists in only one frame of the page. In this page constitution, as will be described later in FIG. 14, data of any frame in which the page information exists and a frame which is designated by the host must be read out. For this reason, the data read time (tR) cannot be further shortened, causing a disadvantage for high-speed operations.

(2) Advantageous for low-power consumption As shown in the (1), since the data output size (the DataOut size) is designated to only a minimum necessary size, the number of data output (the DataOut Size) can be reduced at both the semiconductor memory device (for example, time t7 to t8) and the host (for example, time t9 to t10).

For this reason, the consumed power can be lowered, achieving an advantage for low-power consumption.

Second Embodiment (Read of Only Last 1 KB

Next, the semiconductor memory device of the second embodiment will be explained. The second embodiment relates to an example of the case wherein only the last 1 KB of 16 KB data (15 KB+1 KB) of one page is read. In this explanation, a detailed discussion of those processes and features which overlap with the first embodiment has been omitted. In most respects the second embodiment is substantially similar to the first embodiment excepting the data read sequence.

Figure 10:
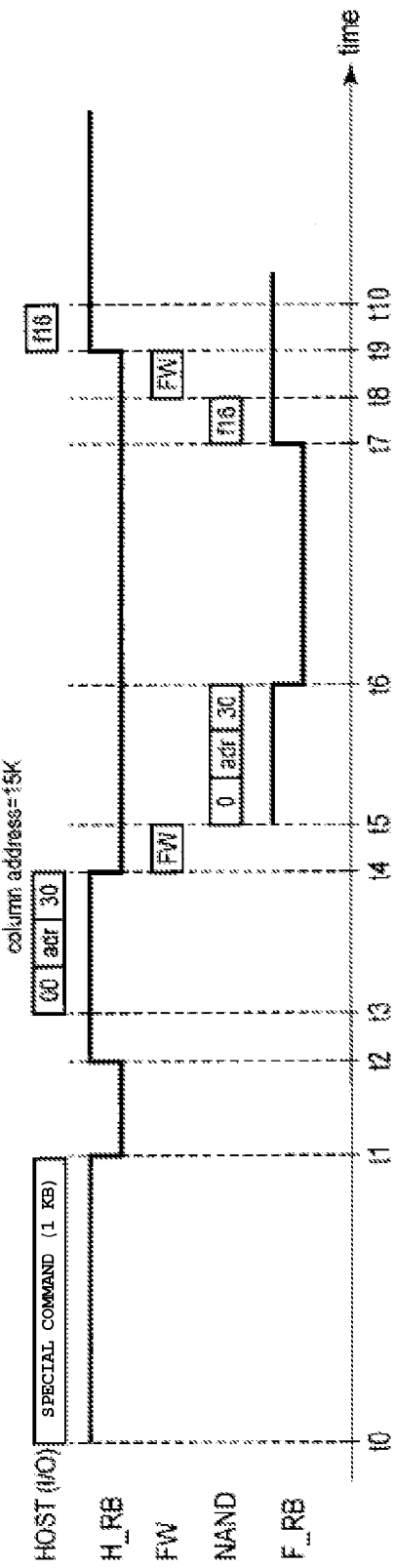
FIG. 10 illustrates the relationship between a host and a semiconductor memory device during a data read operation according to a second embodiment.

The Read sequence of the case where only the last 1 KB is read is shown in FIG. 10.

First, at time t0, in a state in which the ready/busy signal (H_RB) of the host is "Ready," the host transmits a special command for designating the size of DataOut to the controller 21. In this example, this command designates the output of 1 KB.

Next, at time t1 to t2, in a state in which the ready/busy signal (H_RB) of the host is "Busy," the controller 21 sets a variable according to the introduced command. In this example, the variable is set so that only the read data of the sixteenth frame of the last 1 KB are read out.

Next, at time t3, in a state in which the ready/busy signal (H_RB) of the host is "Ready," the host transmits command 00h, address adr, and command 30h to the controller 21. At that time, the start of a column address in this example is set to the last 15 K start (the column address is 15 K).

Next, at time t4 to t5, in a state in which the ready/busy signal (H_RB) of the host is "Busy," the controller 21 implements the following firmware processing (FW). First, whether or not the address adr received is a valid address existing in the NAND type flash memory 11 is decided. Secondly, the amount of data, which are read out a certain address, is determined for the NAND-type flash memory 11 by the column address and the set variable of the received command. In this example, the address that is read out the NAND-type flash memory 11 is 15 K start (the column address is 15 K) according to the column address of the command, and the readout of data up to 16 K is determined by the set variable.

Next, at t5 to t6, in a state in which the ready/busy signal (F_RB) of the memory 11 is "Ready," when the address adr is valid, the controller 21 outputs command 00h, address adr, and command 30h similar to the ones to the NAND-type flash memory 11.

Next, at time t6 to t7, the memory 11 returns the ready/busy signal (F_RB) in a "Busy" state to the controller 21.

Next, at time t7 to t8, in a state in which the ready/busy signal (F_RB) of the memory 11 is "Ready," first, the data of one page are read from the NAND-type flash memory 11. Next, only the read data (f16) of the sixteenth frame of the last 1 KB of the previously read page selected according to the start address and the set size variable is output to the controller 21 from the NAND-type flash memory 11.

Next, at time t8 to t9, the controller 21 implements the following firmware processing (FW). First, for the data (f16) that is subject to DataOut of the sixteenth frame of the last 1 KB, whether or not writing of these data has been finished (that is, whether the frame contains valid data) is decided for each frame from the page information. Secondly, ECC is checked for each frame, and an error correction process is implemented.

Next, at time t9 to t10, in a state in which the ready/busy signal (H_RB) of the host is "Ready," only the data (f16) of the sixteenth frame of the last 1 KB passed through the ECC check are output to the host from the controller 21.

<Operation Effect>

As previously mentioned, according to the semiconductor memory device of the second embodiment, effects similar to the (1) and (2) can be obtained. In addition, like the second embodiment, if necessary, DataOut of only the data (f16) of the last 1 KB of 16 KB data of one page is also possible.

Third Embodiment (Read of Only 4 KB))

Next, the semiconductor memory device of the third embodiment will be explained. The third embodiment relates to the case wherein only a middle 4 KB of 16 KB data (8 KB+4 KB+4 KB) of one page is read out. In this explanation, a detailed discussion of those processes and features which overlap with the first embodiment has been omitted. The third embodiment is substantially similar to the first embodiment excepting the data read sequence.

Figure 11:
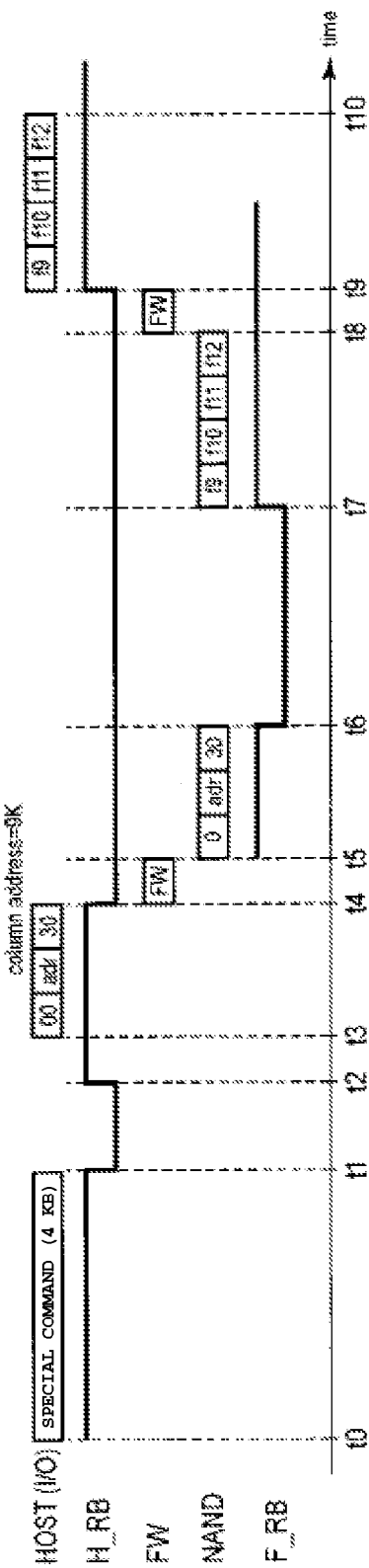
FIG. 11 is a timing chart illustrating the data read operation according to the second embodiment.

The read sequence of the case wherein only 4 KB is read is shown in FIG. 11.

First, at time t0, in a state in which the ready/busy signal (H_RB) of the host is "Ready," similarly, the host transmits a special command for designating the number (size) of DataOut to the controller 21. In this example, this command designates the output of 4 KB.

Next, at time t1 to t2, in a state in which the ready/busy signal (H_RB) of the host is "Busy," a variable is set according to an introduced command so that only the read data in the ninth to twelfth frames of 4 KB are read out.

Next, at time t3, in a state in which the ready/busy signal (H_RB) of the host is "Ready," the host transmits command 00h, address adr, and command 30h to the controller 21. At that time, the start of a column address in this example is set to 9 K start (the column address is 9 K).

Next, at time t4 to t5, in a state in which the ready/busy signal (H_RB) of the host is "Busy," similarly, the controller 21 implements the following firmware processing (FW). In this example, the address that is read out the NAND-type flash memory 11 is 9 K start (the column address is 9 K), and the readout of data up to 13 K is determined by the set size variable.

Next, at t5 to t6, in a state in which the ready/busy signal (F_RB) of the memory 11 is "Ready," when the address adr is valid, the controller 21 outputs command 00h, address adr, and command 30h similar to the ones to the NAND-type flash memory 11.

Next, at time t6 to t7, the memory 11 returns the ready/busy signal (F_RB) in a "Busy" state to the controller 21.

Next, at time t7 to t8, in a state in which the ready/busy signal (F_RB) of the memory 11 is "Ready," first, the data of one page are read from the NAND-type flash memory 11. Next, only the read data (f9 to f12) of the ninth to twelfth frames of 4 KB based on the start address and the set size variable are read out to the sense amplifier (not shown in the figure) in the NAND-type flash memory 11.

Next, at time t8 to t9, a similar firmware processing such as an ECC check is applied to the read data (f9 to f12) of the ninth to twelfth frames of 4 KB read (FW).

Next, at time t9 to t10, in a state in which the ready/busy signal (H_RB) of the host is "Ready," only the data (f9 to f12) of the ninth to twelfth frames of 4 KB passed through the ECC check are output to the host from the controller 21.

<Operation Effect>

As previously mentioned, according to the semiconductor memory device of the second embodiment, effects similar to (1) and (2) can be obtained. In addition, like the third embodiment, if necessary, the read data (f9 to f12) of the ninth to twelfth frames of 4 KB of 16 KB data (8 KB+4 KB+4 KB) of one page can also be output.

Fourth Embodiment (The Case Wherein a Column Address is Changed at HOST After Read of Smaller than 16 KB Data)

Next, the semiconductor memory device of the fourth embodiment will be explained. The fourth embodiment relates to the case wherein a column address is changed at a host after Read less than 16 KB of data. In the following explanation, a detailed explanation of those processes or features overlapping parts with the first embodiment has been omitted. The fourth embodiment is substantially similar to the first embodiment excepting the relationship between host, the controller 21, and the NAND type flash memory 11.

Figure 12:
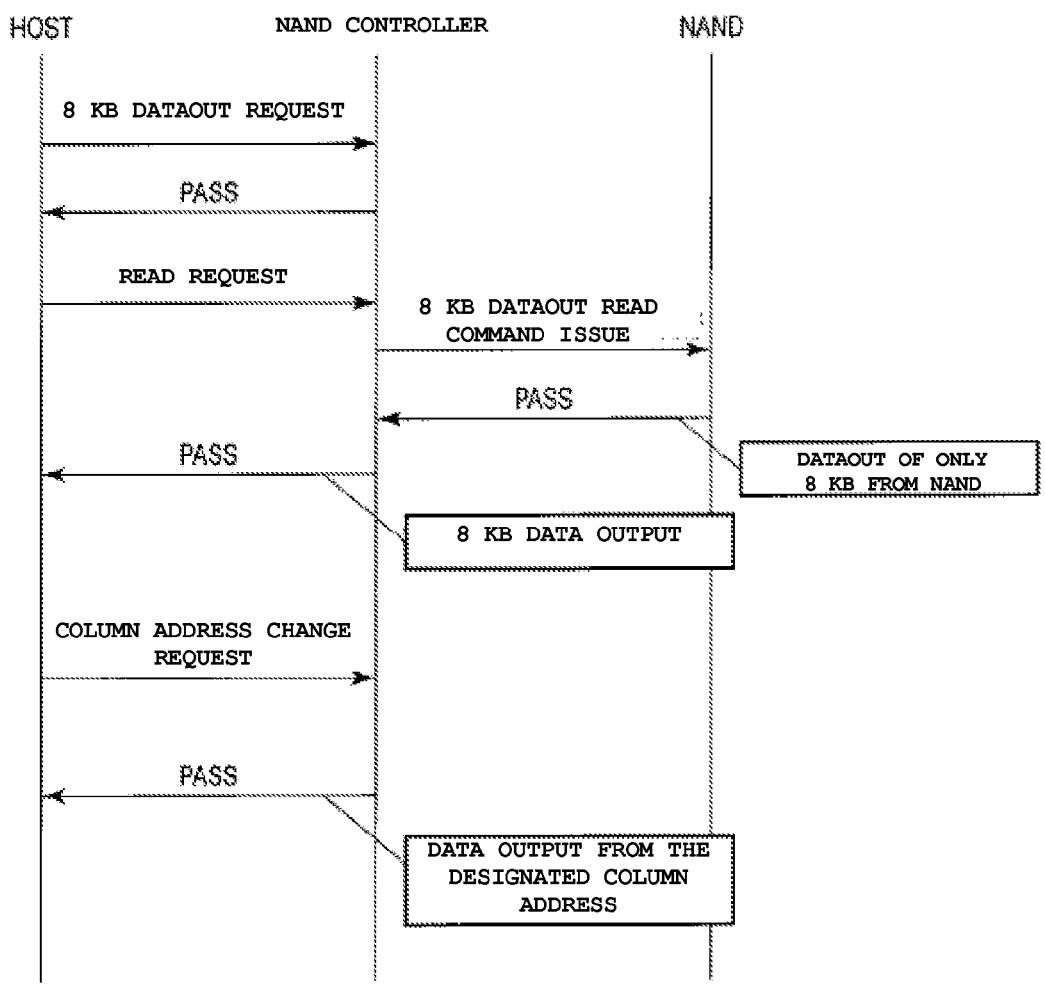
FIG. 12 is a timing chart illustrating a data read operation according to a third embodiment.

The relationship among the host, the controller 21, and the NAND type flash memory 11 of the case wherein a column address is changed at the host after reading less than 16 KB of data will be explained with reference to FIG. 12. Here, like the first embodiment, the case where the column address is changed after outputting read data of only the anterior half 8 KB is mentioned as an example.

As shown in the figure, similar to the first embodiment, the read data of only the anterior half 8 KB are output.

Next, the host requests (with a Column Address Change request) the controller 21 to change the column address at which at least part of the previously read column address is overlapped. In this example, the change of the column address for the overlapping second to eighth frames of the previously read first to eighth frames is requested.

Next, if the change request of the column address is received, the external host immediately outputs the designated second to eighth frames without reading the data out of the NAND-type flash memory 11. The reason for this is that the read data once output (read data of the first to eighth frames of the anterior half 8 KB in this example), for example, are recorded in data cache circuit in the NAND-type flash memory 11.

For this reason, of the previously read data, the read data related to the address change request in which at least part of the address is overlapped can be immediately output without reading the data out of the NAND-type flash memory 11.

Figure 13:
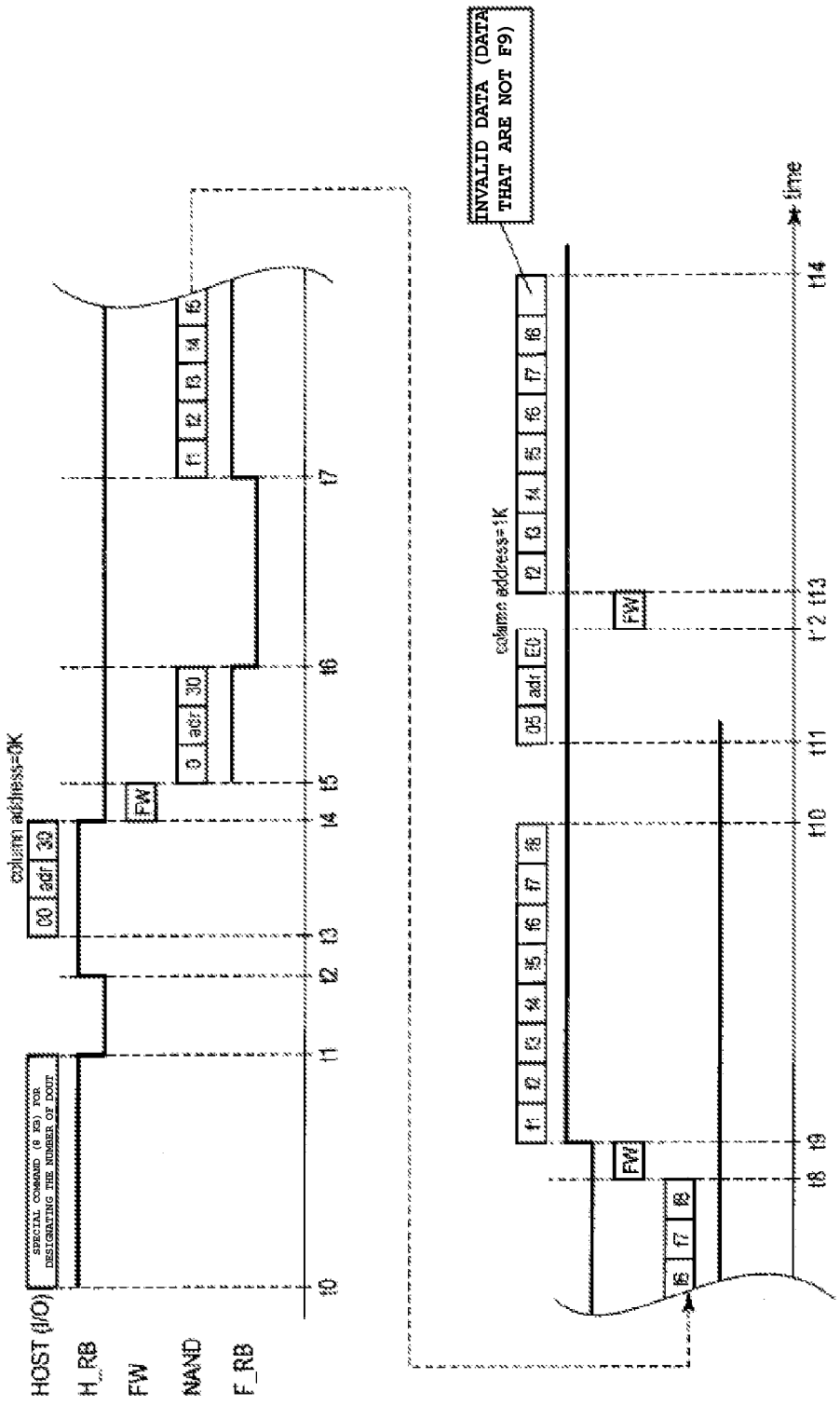
FIG. 13 is a timing chart illustrating a data read operation according to a fourth embodiment.

The read sequence of the case wherein the column address is changed after outputting the read data of only the 8 KB is shown in FIG. 13.

First, as shown in the figure, at time t0 to t10, read data of the designated anterior half 8 KB are output.

Next, at time t11, in a state in which the ready/busy signal (H_RB) of the host is "Ready," the host transmits command 05h, address adr, and command E0 related to the column change request to the controller 21. At that time, the start of the column address is set to 1 K start (the column address is 1 K).

Next, at time t12 to t13, in a state in which the ready/busy signal (H_RB) of the host is "Busy," the controller 21 implements the following firmware processing (FW). The read data (f2 to f8) of the designated second to eighth frames are immediately output to the host from the controller 21, without reading the data from the NAND-type flash memory 11, by the received command and the set variable. In this example, the address that is read out of the NAND-type flash memory 11 by the command is 1 K start (the column address is 1 K), and data up to 13 K are read out by the set variable. The reason for this is that the read data (f1 to f8) of the first to eighth frames once output, for example, are recorded in data cache circuit in the controller 21.

At that time, in the re-output data related to the address change, invalid data are added to maintain the previous data size. For example, in this example, as shown in the figure, invalid data (data except for f9) are added to the final frame of DataOut of the re-output related to the address change to make the data size similar to the previous data size.

<Operation Effect>

Effects similar to the (1) and (2) described above can be obtained in a semiconductor device according to the fourth embodiment.

In addition, according to the fourth embodiment, after outputting read data of only the anterior half 8 KB, the read data of the second to the eighth frames related to the change request of the column address, in which at least part of the address is overlapped, can be immediately output without reading the data out of the NAND-type flash memory 11.

For example, after a change request of the column address, the controller 21 immediately outputs the read data of the designated second to eighth frames without reading the data out of the NAND-type flash memory 11. The reason for this is that the read data once output (the read data of the first to eighth frames of the anterior half 8 KB in this example), for example, are recorded in data cache circuit in the controller 21.

For this reason, of the previously read data, the read data related to the address change request can be immediately output without reading the data out of the NAND-type flash memory 11.

Here, the re-output of the read data of the column address change can be similarly applied several times and, therefore, is not limited to one time. The reason for this is that the read data once output (the read data of the first to eighth frames of the anterior half 8 KB in this example), for example, are recorded in a data cache circuit in the NAND-type flash memory 11.

(Reference Example)

Next, a semiconductor memory device of a reference example will be explained to compare it with the first through the fourth embodiments.

In the reference example, as shown in FIG. 4A, the difference from the first through the fourth embodiments is a page constitution in which only page information exists in one frame of the page. For this reason, as shown in the first through the fourth embodiments, the page information cannot be added to each frame, and whether or not the output of DataOut is required cannot be performed for each frame.

In addition, in this page constitution, data of any of a frame, in which the page information exists, and a frame, which is designated by the host, must be read out. For this reason, the data read time (tR) cannot be further shortened, causing a disadvantage for high-speed operations.

Figure 14:
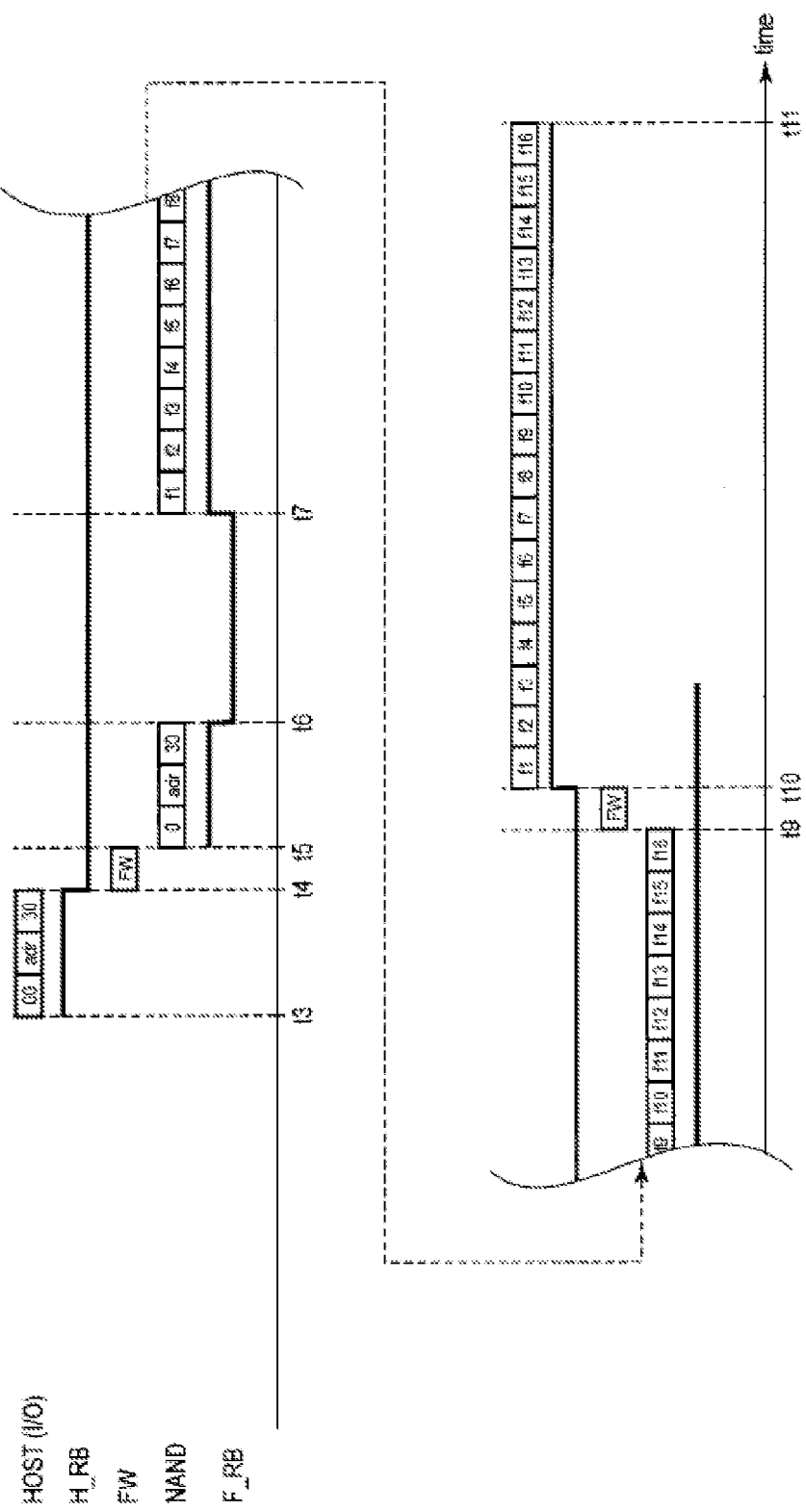
FIG. 14 is a timing chart illustrating a data read operation according to a reference example.

The read data sequence of the reference example is shown in FIG. 14.

First, as shown in the figure, a special command for designating the number of DataOut according to the first through the fourth embodiments is not transmitted to the controller 21 from the host.

For this reason, at time t7 to t9, the controller 21 reads all of the data (f1 to f16) of one page of the first to the sixteenth frames out of the NAND-type flash memory 11, regardless of the data of the frame that is designated by the host.

Next, after a prescribed firmware processing, at time t10 to t11, the controller 21 outputs all of the data (f1 to F16) of one page of the first to the sixteenth frames to the host, regardless of the data of the frame that is designated by the host.

Therefore, in the reference example, for all the data sizes a full page unit must be the read unit and must be read out, regardless of the frame designated by the host. For this reason, the data read time (tR) cannot be further shortened, causing a disadvantage for high-speed operations.

Here, as shown in FIG. 14, the data read time (tR) almost entirely occupies the output (DataOut) time of read data, and it is apparent that the reference example is disadvantageous for high-speed operations.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the first through the fourth embodiments and the reference example are also applicable to a physical address access type semiconductor memory device (for example, SmartNAND™ (trademark)) in which the interface 22 of the NAND-type flash memory 11 includes the ECC function.

What is claimed is:

1. A semiconductor memory device, comprising:
   a memory unit configured for reads and writes in page units;
   an error correction code module configured to generate an error correcting code for each frame unit within a page unit;
   a page information addition module configured to add page information to each frame unit; and
   a controller configured to control a writing of data to the memory unit in response to a write request from an external host, such that for each frame unit of data that is written, the error correcting code and the page information associated with the frame unit of data are written alongside therewith, and configured to control a reading of data that has a size less than a page unit from the memory unit in response to a read request from the external host.

2. The semiconductor memory device of claim 1, wherein the read request designates a starting address and a data size that is less than the size of one page unit.

3. The semiconductor memory device of claim 1, further comprising a data cache for temporarily storing data read from the memory unit.

4. The semiconductor memory device of claim 3, wherein after the read request has been completed, the controller is configured to output from the data cache data that was read in response to a first read request when a second read request designating an address range at least partially overlapping an address range of the first read request is received.

5. The semiconductor memory device according to claim 4, wherein when data are output to the host in response to the second read request, the controller is further configured to add invalid filler data to provide a data designated by the second read request.

6. The memory device of claim 1, wherein the memory unit is a NAND-type flash memory.

7. The memory device of claim 1, wherein the page information for each frame unit is stored as written flag information between adjacent frame units within a same page.

8. The memory device of claim 1, wherein each page information comprises an indication of whether valid data is stored in a page.

9. The memory device of claim 1, wherein the error correction code module is included in a memory unit interface module connected to the memory unit.

10. The memory device of claim 1, wherein the page information addition module is included in a memory unit interface module connected to the memory unit.

11. A semiconductor memory device, comprising:
    a memory unit configured to store data in page units; and
    a controller configured to control reading and writing of data to the memory unit, the controller including:
    a memory unit interface configured to communicate with the memory unit;
    an error correction code module configured to generate an error correction code for each page of data to be written to the memory unit, the error correction code for each page of data establishing a plurality of frames within each page;
    a data read unit connected to the memory unit interface and configured to read data from the memory unit;
    a data write unit connected to the memory unit interface and configured to write data to the memory unit; and
    a page information addition module configured to add page information to each frame of each page to be written by the data write unit, each page information indicating whether the page in which the frame unit is located contains valid data.

12. The semiconductor memory device of claim 11, further comprising a host-side interface configured to communicate with an external host device.

13. The semiconductor memory device of claim 12, wherein the controller is configured to output data to the external host device in less than one page unit.

14. The semiconductor memory device of claim 12, further comprising a data cache for temporarily storing data read from the memory unit;
    wherein the controller is configured to read data from a first data range of the memory unit in response to a first read command from the external host device, to store data from the first data range in the data cache, and to output data from the first data range to the external host device; and
    the controller is further configured to output data from the data cache, without reading additional data from the memory unit, in response to a second read command from the external host device designating a second data range which at least partially overlaps the first data range.

15. The semiconductor memory device of claim 14, wherein the controller is configured to use error correction coding to recreate data in the second data range that was not included in the first data range.

16. A method of controlling reading and writing of data to a memory unit, comprising:
    receiving the data from a host unit;
    sending the data to an error correction code module to generate frame encoded data for a page to be written to the memory unit;
    sending the frame encoded data to a page information addition module which adds page information to each frame of the frame encoded data for the page to be written to the memory unit, each page information indicating whether the page to be written contains valid data; and
    storing the frame encoded data with added page information in the memory unit.

17. The method of claim 16, further comprising:
    receiving a first read request from the host unit, the first read request designating a first data range smaller than one page; and
    outputting data in the first data range to the host unit and no other data in response to the first read request.

18. The method of claim 17, further comprising:
    storing data in the first data range in a data cache.

19. The method of claim 18, further comprising:
    receiving a second read request from the host unit, the second read request designating a second data range smaller than one page;
    determining whether the second data range at least partially overlaps the first data range; and outputting data from the data cache rather than reading from the memory unit in response to the second read request when the second data range at least partially overlaps the first data range.

20. The method of claim 19, wherein an error correction code is used to recreate data in the second data range that was not included in the first data range.

* * * * *